(12) United States Patent
Hong et al.

(10) Patent No.: US 6,251,746 B1
(45) Date of Patent: Jun. 26, 2001

(54) METHODS OF FORMING TRENCH ISOLATION REGIONS HAVING STRESS-REDUCING NITRIDE LAYERS THEREIN

(75) Inventors: Soo-Jin Hong, Seoul; Yung-Seob Yu, Kyunggi-do; Bon-Young Koo, Suwon; Byung-Ki Kim; Seung-Mok Shin, both of Kyunggi-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/415,475

(22) Filed: Oct. 8, 1999

(30) Foreign Application Priority Data

Oct. 9, 1998 (KR) .................................................. 98-42300

(51) Int. Cl.[7] .................................................. H01L 21/76
(52) U.S. Cl. .......................... 438/424; 438/221; 438/296; 438/435; 438/439
(58) Field of Search .................................... 438/424, 221, 438/435, 439, 296

(56) References Cited

U.S. PATENT DOCUMENTS

| | | | |
|---|---|---|---|
| 4,352,724 | * 10/1982 | Susishima et al. | 204/192 |
| 4,390,393 | 6/1983 | Ghezzo et al. | 156/643 |
| 4,571,819 | * 2/1986 | Rogers et al. | 438/424 |
| 4,631,803 | * 12/1986 | Hunter et al. | 438/424 |
| 4,636,281 | 1/1987 | Buiguez et al. | 156/643 |
| 4,656,497 | 4/1987 | Rogers et al. | 357/50 |
| 4,825,277 | 4/1989 | Mattox et al. | 357/49 |
| 4,836,887 | * 6/1989 | Daubenspeck et al. | 156/643 |
| 4,960,727 | 10/1990 | Mattox et al. | 437/67 |
| 5,189,501 | 2/1993 | Kawamura et al. | 257/647 |
| 5,190,889 | 3/1993 | Poon et al. | 437/67 |
| 5,206,182 | 4/1993 | Freeman | 437/33 |
| 5,223,736 | 6/1993 | Rodder | 257/506 |
| 5,316,965 | 5/1994 | Philipossian et al. | 437/70 |
| 5,387,539 | 2/1995 | Yang et al. | 437/67 |
| 5,447,884 | 9/1995 | Fahey et al. | 437/67 |
| 5,472,904 | 12/1995 | Figura et al. | 437/67 |
| 5,474,953 | 12/1995 | Shimizu et al. | 437/67 |

(List continued on next page.)

FOREIGN PATENT DOCUMENTS

001052690A2 * 11/2000 (EP) .......................... H01L/21/336
61-137338 6/1986 (JP) .

OTHER PUBLICATIONS

Stanley Wolf Silicon Processing for the VSLI Era vol. 1 Lattice Press 1986 p. 546 and 581.*
Park et al., "Correlation between Gate Oxide Reliability and the Profile of the Trench Top Corner in Shallow Trench Isolation (STI)," International Electron Devices Meeting, 1996, pp. 747–750.

*Primary Examiner*—Charles Bowers
*Assistant Examiner*—David S Blum
(74) *Attorney, Agent, or Firm*—Myers Bigel Sibley & Sajovec (57) ABSTRACT

Methods of forming trench isolation regions include the steps of forming a trench masking layer comprising a first material (e.g., polysilicon) on a semiconductor substrate and then etching a trench in the semiconductor substrate, using the trench masking layer as etching mask. A trench nitride layer comprising a second material different from the first material is then formed on a sidewall of the trench and on a sidewall of the trench masking layer. The trench is then filled with a trench insulating material (e.g., USG). The trench masking layer is then removed by selectively etching the trench masking layer with an etchant that selectively etches the first material at a higher rate than the second material. This step of removing the trench masking layer results in exposure of a protruding portion of the trench nitride layer but does not cause the trench nitride layer to become recessed. The trench insulating material and the trench nitride layer are then etched back to define the trench isolation region.

26 Claims, 8 Drawing Sheets

U.S. PATENT DOCUMENTS

| | | | |
|---|---|---|---|
| 5,492,858 | 2/1996 | Bose et al. | 437/67 |
| 5,521,422 | 5/1996 | Mandelman et al. | 257/510 |
| 5,554,256 | 9/1996 | Pruijmboom et al. | 156/643.1 |
| 5,561,073 * | 10/1996 | Jerome et al. | 438/424 |
| 5,578,518 | 11/1996 | Koike et al. | 437/67 |
| 5,612,242 | 3/1997 | Hsu | 437/56 |
| 5,643,823 | 7/1997 | Ho et al. | 437/67 |
| 5,674,775 | 10/1997 | Ho et al. | 437/67 |
| 5,677,233 | 10/1997 | Abiko | 437/67 |
| 5,677,234 | 10/1997 | Koo et al. | 437/69 |
| 5,679,599 | 10/1997 | Mehta | 437/69 |
| 5,696,020 | 12/1997 | Ryum et al. | 437/72 |
| 5,712,185 | 1/1998 | Tsai et al. | 437/67 |
| 5,712,205 | 1/1998 | Park et al. | 438/425 |
| 5,719,085 * | 2/1998 | Moon et al. | 438/424 |
| 5,728,621 * | 3/1998 | Zheng et al. | 438/424 |
| 5,750,433 | 5/1998 | Jo | 438/424 |
| 5,753,562 | 5/1998 | Kim | 438/424 |
| 5,763,315 * | 6/1998 | Bennedict et al. | 438/424 |
| 5,780,346 * | 7/1998 | Arghavani et al. | 438/296 |
| 5,786,262 | 7/1998 | Jang et al. | 438/424 |
| 5,834,358 | 11/1998 | Pan et al. | 438/424 |
| 5,837,595 | 11/1998 | Ahn et al. | 438/443 |
| 5,837,612 | 11/1998 | Ajuria et al. | 438/697 |
| 5,858,842 | 1/1999 | Park | 438/297 |
| 5,861,104 | 1/1999 | Omid-Zohoor | 216/84 |
| 5,863,827 | 1/1999 | Joyner et al. | 438/425 |
| 5,866,465 * | 2/1999 | Doan et al. | 438/424 |
| 5,872,045 * | 2/1999 | Lou et al. | 438/432 |
| 5,885,883 | 3/1999 | Park et al. | 438/435 |
| 5,940,716 | 8/1999 | Jin et al. | 438/424 |
| 5,976,951 * | 11/1999 | Huang et al. | 438/435 |
| 5,977,525 * | 11/1999 | Vasche | 257/321 |
| 5,989,978 * | 11/1999 | Peidous | 438/436 |
| 5,994,200 | 11/1999 | Kim | 438/425 |
| 6,001,707 | 12/1999 | Lin et al. | 438/433 |
| 6,004,862 | 12/1999 | Kim et al. | 438/425 |
| 6,008,108 | 12/1999 | Huang et al. | 438/436 |
| 6,030,882 | 2/2000 | Hong | 438/433 |
| 6,037,237 | 3/2000 | Park et al. | 438/424 |
| 6,047,932 * | 6/2000 | Wu | 438/425 |
| 6,054,343 * | 4/2000 | Asburn | 438/221 |
| 6,057,208 | 5/2000 | Lin et al. | 438/424 |
| 6,090,684 * | 7/2000 | Ishituska et al. | 438/424 |
| 6,093,611 * | 7/2000 | Gardner et al. | 438/295 |
| 6,103,635 * | 8/2000 | Chau et al. | 438/739 |

* cited by examiner

METHODS OF FORMING TRENCH ISOLATION REGIONS HAVING STRESS-REDUCING NITRIDE LAYERS THEREIN

RELATED APPLICATION

This application is related to Korean Application No. 98-42300, filed Oct. 9, 1998, the disclosure of which is hereby incorporated herein by reference.

FIELD OF THE INVENTION

This invention relates to methods of forming integrated circuit devices, and more particularly to methods of forming electrical isolation regions in semiconductor substrates.

BACKGROUND OF THE INVENTION

Trench isolation techniques have been considered as alternatives to local oxidation of silicon (LOCOS) isolation techniques because trench isolation techniques provide fully recessed oxides, may be planarized, do not result in the formation of bird's beaks oxide extensions and typically do not suffer from field oxide thinning effects. Such trench isolation techniques are more fully described in U.S. Pat. No. 5,750,433 to Jo entitled "Methods of Forming Electrically Isolated Active Region Pedestals Using Trench-Based Isolation Techniques", U.S. Pat. No. 5,753,562 to Kim entitled "Methods of Forming Semiconductor Devices In Substrates Having Inverted-Trench Isolation Regions Therein", and U.S. Pat. No. 5,858,842 to Park entitled "Methods of Forming Combined Trench and Locos-Based Electrical Isolation Regions In Semiconductor Substrates, all assigned to the present assignee, the disclosures of which are hereby incorporated herein by reference.

Unfortunately, the performance of thermal oxidation steps when forming trench isolation regions may cause volume expansion defects and dislocations to form adjacent the sidewalls and corners of the trenches as migrating oxygen reacts with the silicon at the trench sidewall interfaces. As will be understood by those skilled in the art, these defects and dislocations can degrade the electrical characteristics of devices formed in active regions which extend adjacent the trench isolation regions.

To address these limitations associated with conventional trench isolation techniques, attempts have been made to add stress-relieving liners (e.g., ON and ONO liners) to the sidewalls and bottoms of trenches. Such attempts are disclosed in U.S. Pat. Nos. 4,631,803, 5,189,501, 5,190,889 and 5,206,182. Unfortunately, conventional processing techniques may cause removal of the stress relieving lining material and result in the formation of voids which can degrade the electrical isolation characteristics of the trench isolation regions. For example, as illustrated by FIGS. 1A–1B, conventional processing techniques may cause a trench nitride layer 10 to become recessed and the formation of a void as illustrated by highlighted region 14.

Figure 1A:
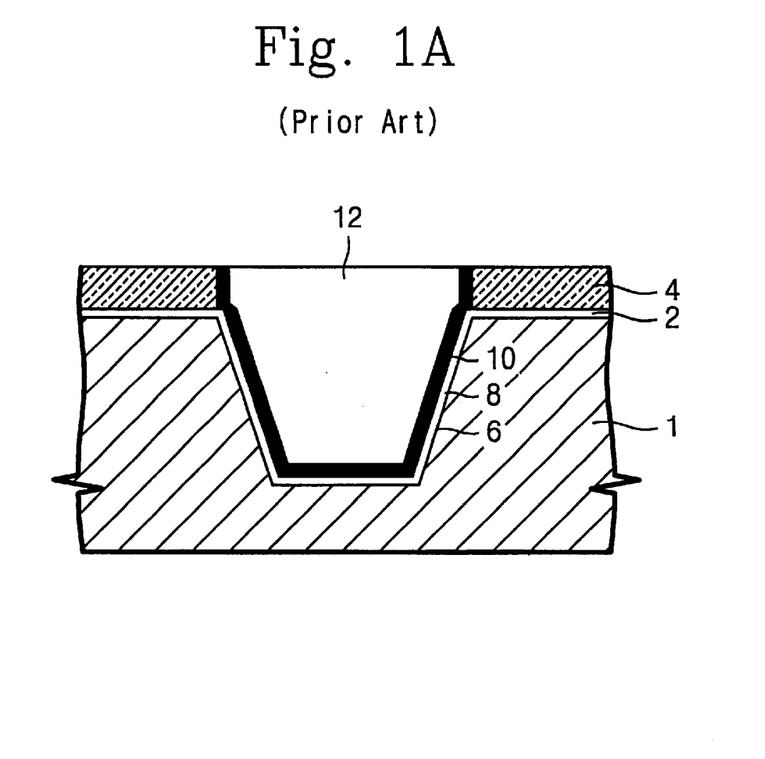
FIGS. 1A–1B are cross-sectional views of intermediate structures that illustrate a conventional method of forming a trench isolation region.
Figure 1B:
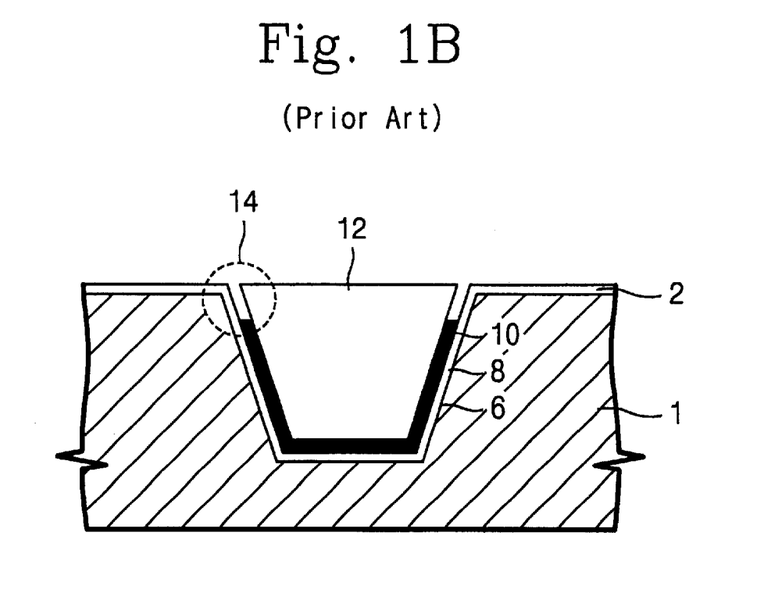

In particular, FIG. 1A illustrates a trench isolation region at an intermediate stage of processing. This trench isolation region may be formed by thermally oxidizing a face of a substrate 1 to define a pad oxide layer 2 and then depositing a silicon nitride masking layer 4 on the pad oxide layer 2. The silicon nitride masking layer 4 may then be patterned using conventional photolithographically defined etching steps. The silicon nitride masking layer 4 may then be used as an etching mask during the formation of a trench 6 in the substrate 1. The sidewalls and bottom of the trench 6 may then be thermally oxidized to define a trench oxide layer 8. A trench nitride layer 10 may then be deposited on the trench oxide layer 8 and on the silicon nitride masking layer 4. The trench may then be filled with an electrically insulating material 12 (e.g., USG). A planarization step may then be performed, using the silicon nitride masking layer 4 as a planarization-stop. Then, as illustrated by FIG. 1B, an etching step can be performed using a wet etchant (e.g., phosphoric acid) to remove the silicon nitride masking layer 4. Unfortunately, this etching step may also cause the trench nitride layer 10 to become recessed, as illustrated. The extent of this recession may be reduced by using thinner trench nitride layers 10, however, the use of thinner trench nitride layers 10 may reduce the stress-relieving benefits provided by the trench nitride layers 10. Such techniques to use thinner trench nitride layers 10 are more fully disclosed in U.S. Pat. No. 5,447,884.

Thus, notwithstanding the above-described methods of forming trench isolation regions, there continues to be a need for improved methods of forming trench isolation regions.

SUMMARY OF THE INVENTION

It is therefore an object of the present invention to provide improved methods of forming trench isolation regions in semiconductor substrates.

It is another object of the present invention to provide methods of forming trench isolation regions that inhibit the formation of dislocations and stresses in portions of a semiconductor substrate extending adjacent the trench isolation regions.

It is still another object of the present invention to provide methods of forming integrated circuit substrates having active devices therein that are not adversely influenced by defects within adjacent trench isolation regions.

These and other objects, advantages and features of the present invention are provided by methods of forming trench isolation regions that include the steps of forming a trench masking layer comprising a first material (e.g., polysilicon) on a semiconductor substrate and then etching a trench in the semiconductor substrate, using the trench masking layer as etching mask. A trench nitride layer comprising a second material different from the first material is then formed on a sidewall of the trench and on a sidewall of the trench masking layer. The trench is then filled with a trench insulating material (e.g., USG). The trench masking layer is then removed by selectively etching the trench masking layer with an etchant that selectively etches the first material at a higher rate than the second material. This step of removing the trench masking layer results in exposure of a protruding portion of the trench nitride layer but does not cause the trench nitride layer to become recessed. The trench insulating material and the trench nitride layer are then etched back to define the trench isolation region.

According to one aspect of the present invention, the step of forming a trench nitride layer is preceded by the step of forming a trench oxide layer on the sidewall of the trench and on a sidewall of the trench masking layer. In particular, the trench oxide layer is formed on a sidewall of the trench masking layer by thermally oxidizing the sidewall of the trench masking layer. The step of etching back the trench insulating material also preferably comprises the step of etching the trench insulating material and the trench oxide layer simultaneously, to expose a protruding portion of the trench nitride layer and then etching the protruding portion of the trench nitride layer. The step of forming a trench masking layer is also preferably preceded by the step of forming a pad oxide layer on a surface of the semiconductor substrate. The step of removing the trench masking layer is also preferably performed by exposing the trench masking layer to an etching solution comprising $HNO_3$, $CH_3COOH$, HF and deionized water.

To further reduce stress within the semiconductor substrate, the trench nitride layer preferably comprises a silicon-rich nitride layer as $Si_{3+\alpha}N_4$, where $\alpha>0$, having a thickness in a range between about 70 Å and 300 Å.

According to another embodiment of the present invention, a method of forming a trench isolation region comprises the steps of forming a first trench masking layer comprising polysilicon on a semiconductor substrate and forming a second trench masking layer comprising silicon nitride on the first trench masking layer. A trench is then etched into the semiconductor substrate, using the first trench masking layer as etching mask. A trench nitride layer is then formed on a sidewall of the trench and on sidewalls of the first and second trench masking layers. The trench is then filled with a trench insulating material (e.g., USG and PE-TEOS). The second trench masking layer is then removed using conventional etching techniques and this step also results in the removal of an upper protruding portion of the trench nitride layer. The first trench masking layer is then removed by selectively etching the first trench masking layer with an etchant that selectively etches polysilicon at a higher rate than silicon nitride. The trench insulating material and the trench nitride layer are then etched-back to define the trench isolation region. To further prevent recession of the trench nitride layer, the step of etching the trench may be preceded by a step to etch a recess in the first trench masking layer.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer or region is described as being "directly on" another layer or region, no intervening layers or regions are present. Like numbers refer to like elements throughout.

Figure 2A:
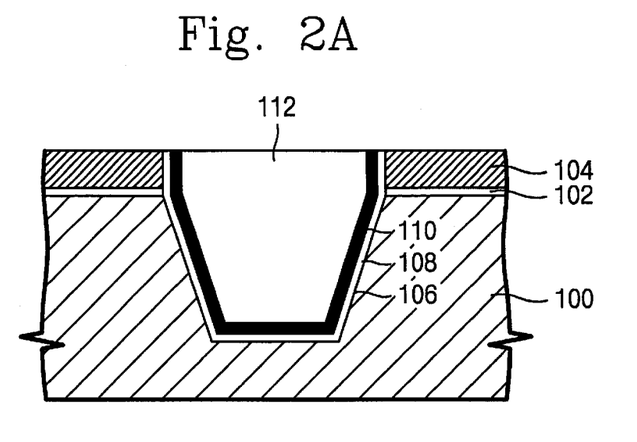
FIGS. 2A–2C are cross-sectional views of intermediate structures that illustrate methods of forming trench isolation regions according to a first embodiment of the present invention.
Figure 2B:
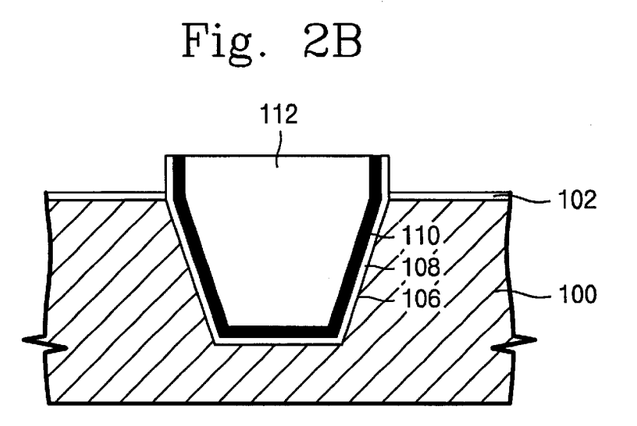
Figure 2C:
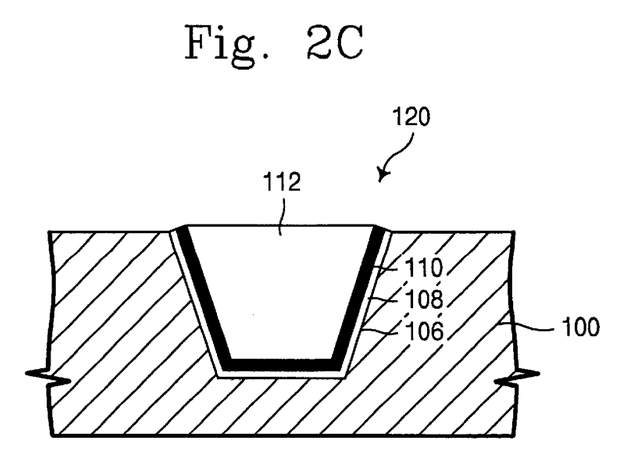

Referring now to FIGS. 2A–2C, preferred methods of forming trench isolation regions according to a first embodiment of the present invention will be described. In particular, FIG. 2A illustrates the steps of forming a pad oxide layer 102 and a polysilicon layer 104 on a semiconductor substrate 100. An anti-reflective layer (not shown) may also be formed on the polysilicon layer 104. The pad oxide layer 102 may be formed by thermally oxidizing an upper surface of the substrate 100 and may have a thickness in a range between about 100 Å and 240 Å. The polysilicon layer 104 may be deposited on the pad oxide layer 102 using a low pressure chemical vapor deposition (LPCVD) technique or a plasma enhanced chemical vapor deposition (PECVD) technique, for example.

The deposited polysilicon layer 104 may have a thickness of about 3000 Å or less, and more preferably only about 800 Å. The anti-reflective layer may also comprise a silicon oxynitride layer (SiON) having a thickness of about 600 Å. As described more fully hereinbelow, the polysilicon layer 104 is used instead of a nitride layer (e.g., the silicon nitride layer 4 in FIG. 1A) because, among other things, it has a high degree of etching selectively relative to silicon nitride and because it typically induces less stress within the substrate 100 relative to a silicon nitride layer. The anti-reflective layer serves to improve the accuracy of photo-lithographically defined etching steps (by reducing critical dimension variation) and also serves as a masking layer during subsequent trench etching steps.

Using conventional photolithographically defined etching steps, the anti-reflective layer and the polysilicon layer 104 are then sequentially etched to expose the pad oxide layer 102. The etched anti-reflective layer and the etched polysilicon layer 104 are then used as an etching mask during the step of etching the pad oxide layer 102 to expose the substrate 100 and then etching the substrate 100 to define a trench 106 therein. During these etching steps, the anti-reflective layer may also be completely etched.

Referring still to FIG. 2A, a thermal oxidation step is then performed to define a trench oxide layer 108 on the sidewalls and on the bottom of the trench 106. In addition, according to a preferred aspect of the present invention, this thermal oxidation step also results in the oxidation of the exposed sidewalls of the polysilicon layer 104. As a result of this thermal oxidation step, a trench oxide layer 108 having a preferred thickness in a range between about 30 Å and 110 Å may be formed. Because the bottom and top corners of the trench 106 may be susceptible to crystal defects caused by the thermal oxidation step, a trench nitride layer 110 may be formed as a stress-relief layer on the trench oxide layer 108, as illustrated. According to another preferred aspect of the present invention, this trench nitride layer 110 preferably comprises a silicon-rich silicon nitride layer (e.g., $Si_{3+\alpha}N_4$, where $\alpha>0$). The use of a silicon-rich silicon nitride layer is advantageous because it reduces stress in the substrate 100 to a greater degree than a conventional silicon nitride layer $Si_3N_4$. The trench nitride layer 110 may be formed using a low pressure chemical vapor deposition technique (LPCVD). The trench nitride layer 110 is formed to have a thickness in a range between about 70 Å and 300 Å, and more preferably about 100 Å. As described more fully hereinbelow, the trench nitride layer 110 may be formed as a relatively thick layer because of the reduced likelihood of recession during subsequent process steps.

The trench 106 is then filled with a first electrically insulating material layer such as undoped silicate glass (USG) that is deposited using a plasma enhanced chemical vapor deposition technique (PECVD). To relieve stresses within the first electrically insulating material layer, an additional second insulating material layer, such as a plasma enhanced tetraethylorthosilicate (PE-TEOS) glass layer, may be deposited on the USG layer. These two material layers are illustrated as a composite trench insulation region 112. As will be understood by those skilled in the art, the thickness of the USG layer is a function of the depth of the trench 106. For example, for a trench depth of about 0.25 microns, the USG layer may be deposited to a thickness of about 5,000 Å and the PE-TEOS layer may be deposited to a thickness of about 1,000 Å. An annealing step is then preferably performed to densify the USG layer and thereby inhibit recession of the trench insulation region 112 during subsequent processing. This annealing step may be performed in a nitrogen ambient ($N_2$) at a temperature of about 1,000° C. to 1,200° C. A planarization step is then performed on the trench insulation region 112, using the polysilicon layer 104 as an etch stop layer. This planarization step may include chemical mechanical polishing (CMP) and chemical etch-back steps.

Referring now to FIG. 2B, the polysilicon "masking" layer 104 is then removed using a wet or dry etching technique, for example. To perform a wet etching step, the polysilicon layer 104 may be exposed to an etching solution containing $HNO_3$, $CH_3COOH$, HF and deionized water. A chlorine-based chemistry ($Cl_2$) may also be used during a dry etching step. As illustrated by FIG. 2C, an upper portion of the trench insulation region 112, the pad oxide layer 102 and exposed portion of the trench oxide layer 108 may then be removed using a chemical etchant solution such as LAL ($NH_4F+HF$). The upper protruding portion of the trench nitride layer 110 may also be removed using conventional etching techniques. However, in contrast to the trench isolation region of FIG. 1B, the trench nitride layer 110 of FIG. 2C is not recessed. Thus, the trench nitride layer 110 may be formed as a relatively thick layer to provide additional stress reduction. As will be understood by those skilled in the art, active devices may then be formed in the active portions of the substrate that are electrically isolated from each other by the trench isolation regions.

Figure 3A:
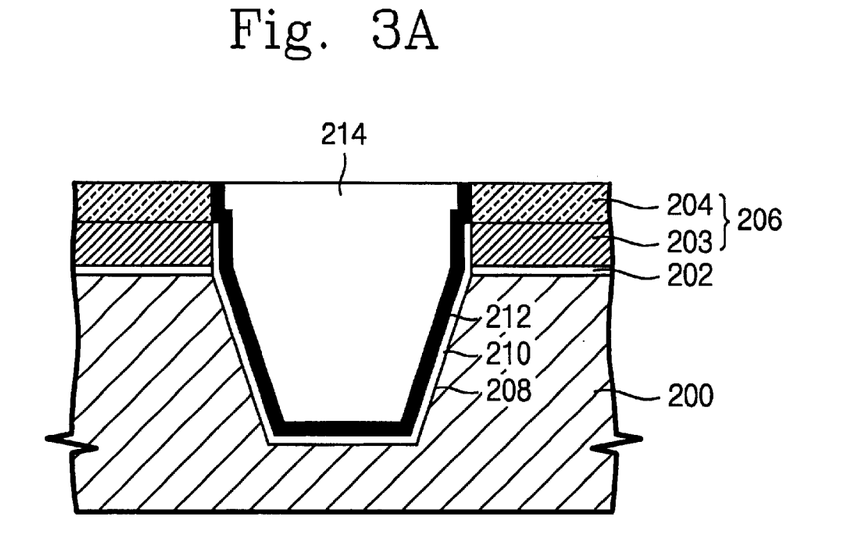
FIGS. 3A–3D are cross-sectional views of intermediate structures that illustrate methods of forming trench isolation regions according to a second embodiment of the present invention.

Referring now to FIGS. 3A–3D, preferred methods of forming trench isolation regions according to a second embodiment of the present invention will be described. In particular, FIG. 3A illustrates the steps of forming a pad oxide layer 202, a polysilicon layer 203 and a nitride (e.g., $Si_3N_4$) masking layer 204 on a semiconductor substrate 200. An anti-reflective layer (not shown) may also be formed on the nitride masking layer 204. The pad oxide layer 202 may be formed by thermally oxidizing an upper surface of the substrate 200 and may have a thickness in a range between about 100 Å and 240 Å. The polysilicon layer 203 may be deposited on the pad oxide layer 202 and may have a thickness of about 800 Å. The nitride masking layer 204 may also be deposited to a thickness of about 700 Å. The anti-reflective layer may also comprise a silicon oxynitride layer (SiON) having a thickness of about 600 Å.

Using conventional photolithographically defined etching steps, the anti-reflective layer, the nitride masking layer 204 and the polysilicon layer 203 are then sequentially etched to expose the pad oxide layer 202. The etched anti-reflective layer, nitride masking layer 204 and polysilicon layer 103 are then used as a trench etching mask 206 during the step of etching the pad oxide layer 202 to expose the substrate 200 and then etching the substrate 200 to define a trench 208 therein. During these etching steps, the anti-reflective layer may also be completely etched.

Referring still to FIG. 3A, a thermal oxidation step is then performed to define a trench oxide layer 210 on the sidewalls and on the bottom of the trench 208. This thermal oxidation step also results in the oxidation of the exposed sidewalls of the polysilicon layer 203. As a result of this thermal oxidation step, a trench oxide layer 210 having a preferred thickness in a range between about 30 Å and 110 Å may be formed. A trench nitride layer 212 may then be formed as a stress-relief layer on the trench oxide layer 210 and on sidewalls of the nitride masking layer 204, as illustrated. The trench nitride layer 212 is formed to have a thickness in a range between about 70 Å and 300 Å, and more preferably about 100 Å.

The trench 208 is then filled with a first electrically insulating material layer such as undoped silicate glass (USG) that is deposited using a plasma enhanced chemical vapor deposition technique (PECVD). To relieve stresses within the first electrically insulating material layer, an additional second insulating material layer, such as a plasma enhanced tetraethylorthosilicate (PE-TEOS) glass layer, may be deposited on the USG layer. These two material layers are illustrated as a composite trench insulation region 214. An annealing step is then preferably performed to densify the USG layer and thereby inhibit recession of the trench insulation region 214 during subsequent processing. This annealing step may be performed in a nitrogen ambient ($N_2$) at a temperature of about 1,000° C. to 1,200° C. A planarization step is then performed on the trench insulation region 214, using the nitride masking layer 204 as an etch stop layer. This planarization step may include chemical mechanical polishing (CMP) and chemical etch-back steps.

Figure 3B:
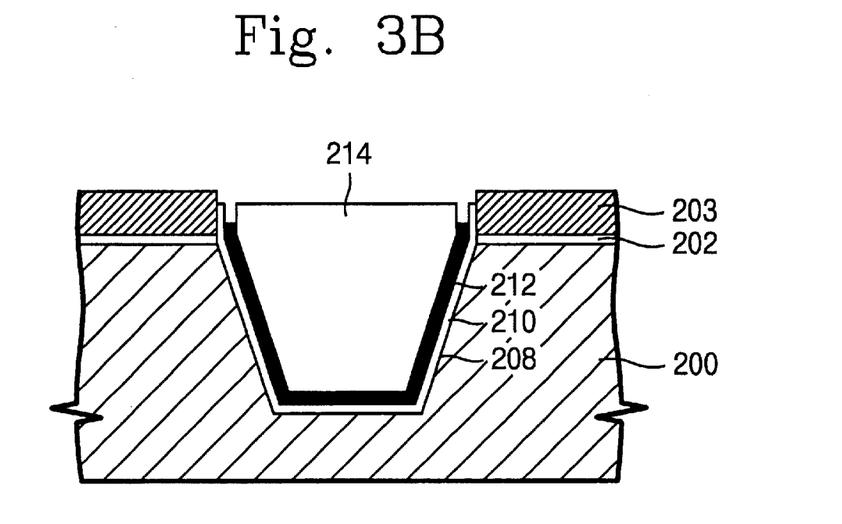
Figure 3C:
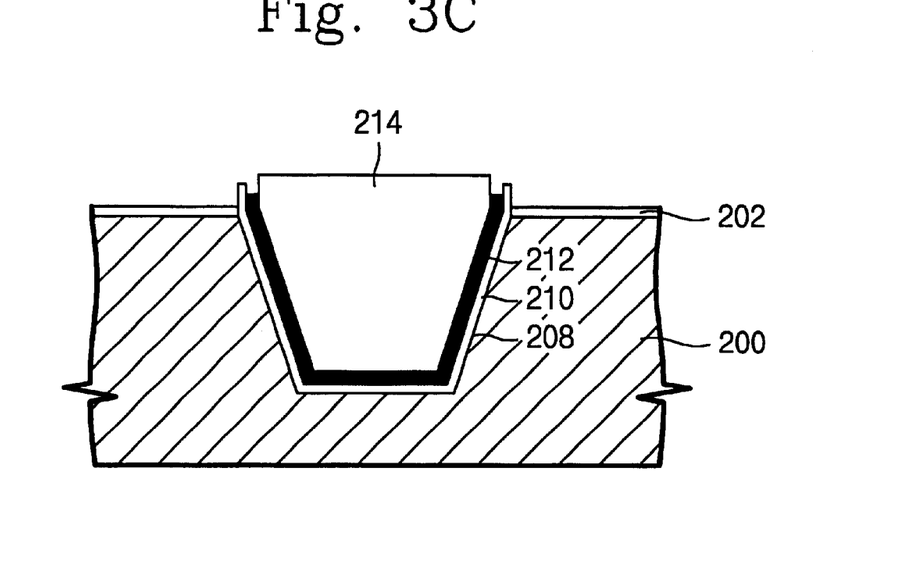
Figure 3D:
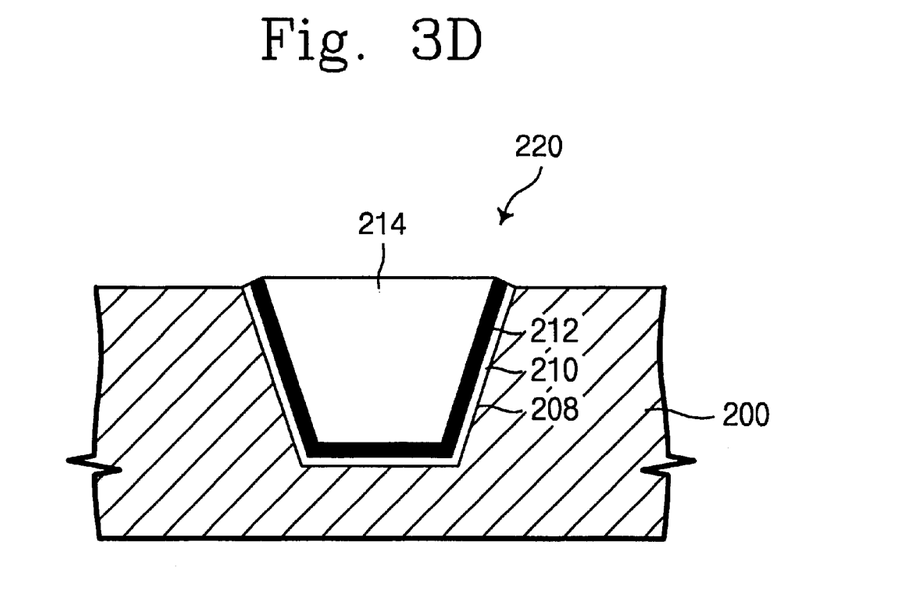

Referring now to FIG. 3B, the nitride masking layer 204 may then be removed using a dry etching technique. During this dry etching step, upper portions of the trench insulation region 214 and the trench nitride layer 212 may also be removed. This dry etching step may include a main etching step using a mixed gas containing $CF_3$, Ar, $CHF_3$ and $O_2$, and an over-etch step using a mixed gas containing Ar and $CHF_3$. Because of the presence of the underlying polysilicon layer 203, the nitride masking layer 204 may also be removed using a wet etching step (e.g., phosphoric acid etching solution). As illustrated by FIG. 3C, the polysilicon layer 203 is then removed using a wet or dry etching technique, for example, as described above with respect to FIG. 2B. Finally, as illustrated by FIG. 3D, an upper portion of the trench insulation region 214, the pad oxide layer 202 and exposed portion of the trench oxide layer 210 may then be removed using a chemical etchant solution such as LAL ($NH_4F+HF$). The upper protruding portion of the trench nitride layer 212 may also be removed using conventional etching techniques.

Figure 4A:
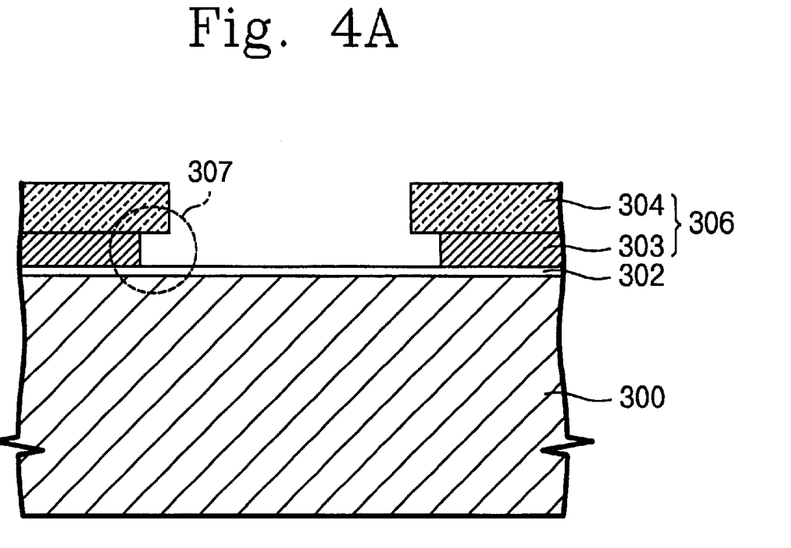
FIGS. 4A–4H are cross-sectional views of intermediate structures that illustrate methods of forming trench isolation regions according to a third embodiment of the present invention.

Referring now to FIGS. 4A–4H, preferred methods of forming trench isolation regions according to a third embodiment of the present invention will be described. In particular, FIG. 4A illustrates the steps of forming a pad oxide layer 302, a polysilicon layer 303 and a nitride (e.g., $Si_3N_4$) masking layer 304 on a semiconductor substrate 300. An anti-reflective layer (not shown) may also be formed on the nitride masking layer 304. The pad oxide layer 302 may be formed by thermally oxidizing an upper surface of the substrate 300 and may have a thickness in a range between about 100 Å and 240 Å. The polysilicon layer 303 may be deposited on the pad oxide layer 302 and may have a thickness of about 800 Å. The nitride masking layer 304 may also be deposited to a thickness of about 700 Å. The anti-reflective layer may also comprise a silicon oxynitride layer (SiON) having a thickness of about 600 Å. Using conventional photolithographically defined etching steps, the anti-reflective layer, the nitride masking layer 304 and the polysilicon layer 303 are then sequentially etched to expose the pad oxide layer 302.

Then, as illustrated by highlighted region 307, a selective etching step is then performed to laterally etch the polysilicon layer 303 and define a lateral recess therein having a recess width of about 200 Å to 700 Å. This selective lateral etching step may be performed as a dry etching step using a mixed gas containing $SF_6$ and $Cl_2$ or a wet etching step using a mixed solution of $HNO_3$, $CH_3COOH$, HF and deionized water.

Figure 4B:
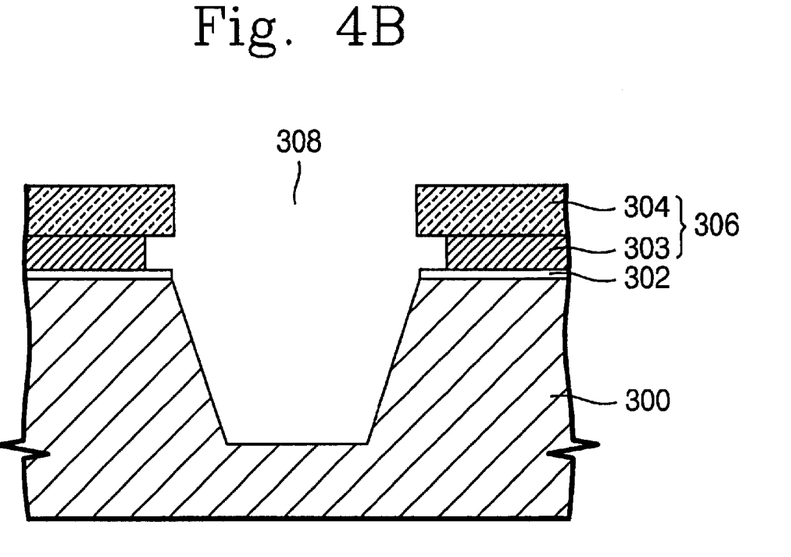
Figure 4C:
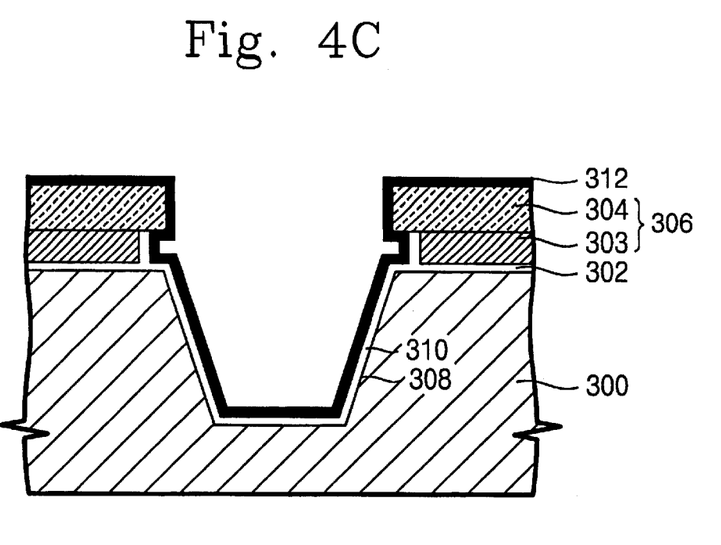
Figure 4D:
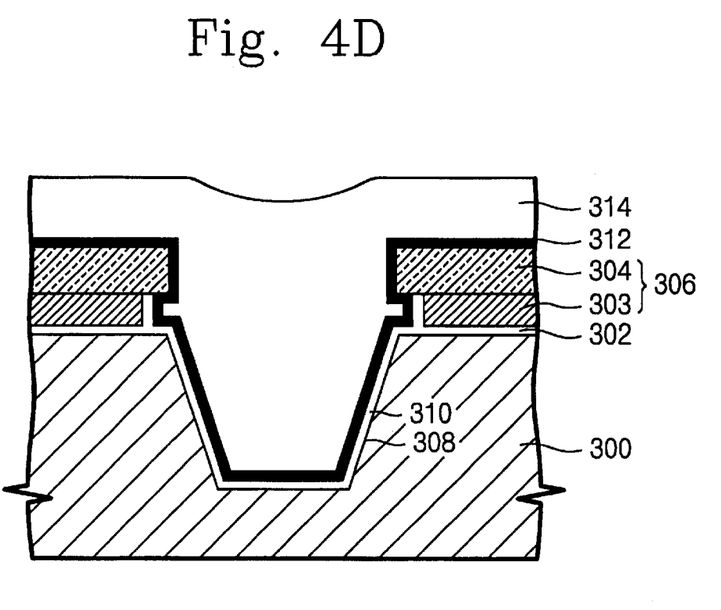

Referring now to FIG. 4B, the resulting mask pattern 306 is used as an etching mask during the step of etching the pad oxide layer 302 to expose the substrate 300 and then etching the substrate 300 to define a trench 308 therein. Referring now to FIG. 4C, a thermal oxidation step is then performed to define a trench oxide layer 310 on the sidewalls and on the bottom of the trench 308. This thermal oxidation step also results in the oxidation of the exposed sidewalls of the polysilicon layer 303. A trench nitride layer 312 may then be formed as a stress-relief layer on the trench oxide layer 310 and on sidewalls of the nitride masking layer 304, as illustrated. As illustrated by FIG. 4D, the trench 308 is then filled with a first electrically insulating material layer such as undoped silicate glass (USG) that is deposited using a plasma enhanced chemical vapor deposition technique (PECVD). To relieve stresses within the first electrically insulating material layer, an additional second insulating material layer, such as a plasma enhanced tetraethylorthosilicate (PE-TEOS) glass layer, may be deposited on the USG layer. These two material layers are illustrated as a composite trench insulation region 314. An annealing step is then preferably performed to densify the USG layer and thereby inhibit recession of the trench insulation region 314 during subsequent processing.

Figure 4E:
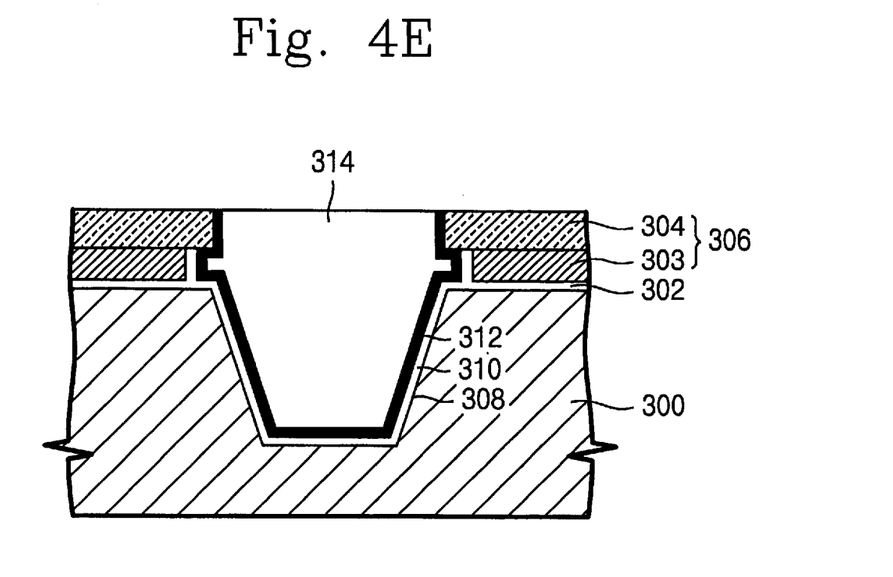
Figure 4F:
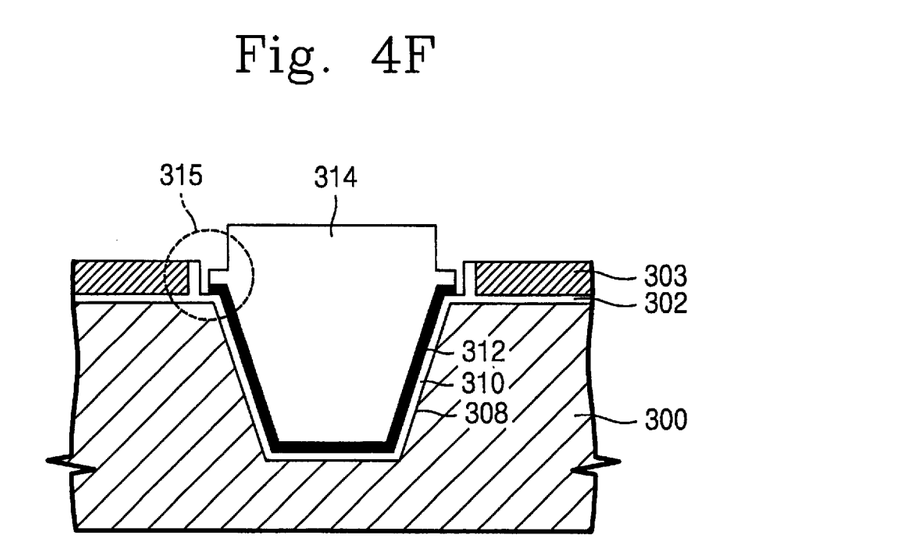

As illustrated by FIG. 4E, a planarization step is then performed on the trench insulation region 314, using the nitride masking layer 304 as an etch stop layer. Referring now to FIG. 4F, the nitride masking layer 304 may then be removed using a dry etching technique. During this dry etching step, portions of the trench insulation region 314 and trench nitride layer 312 may also be removed. This dry etching step may include a main etching step using a mixed gas containing $CF_3$, Ar, $CHF^3$, and $O_2$, and an over-etch step using a mixed gas containing Ar and $CHF_3$. Because of the presence of the underlying polysilicon layer 303, the nitride masking layer 304 may also be removed using a wet etching step (e.g., phosphoric acid etching solution). As illustrated by highlighted region 315, the lateral extensions of the trench insulation region 314 inhibit penetration of the etchant and removal of the trench nitride layer 312 from upper sidewalls of the trench 308.

Figure 4G:
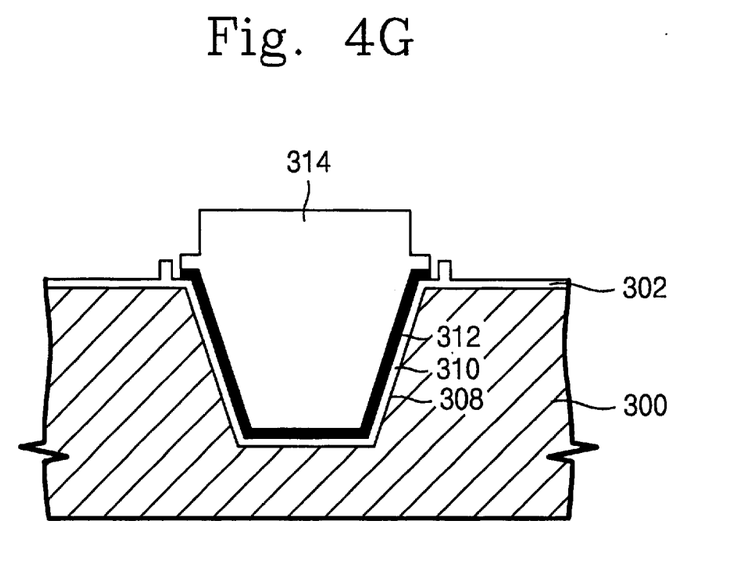
Figure 4H:
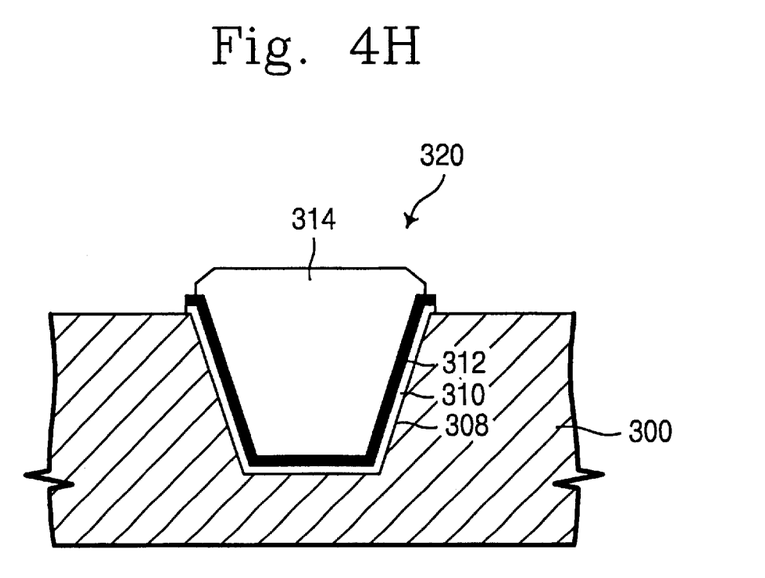

As illustrated by FIG. 4G, the polysilicon layer 303 is then removed using a wet or dry etching technique, for example, as described above with respect to FIG. 2B. Here, because the high degree of etching selectivity between polysilicon and silicon nitride, the trench nitride layer 312 is not etched significantly during removal of the polysilicon layer 303. Finally, as illustrated by FIG. 4H, an upper portion of the trench insulation region 314 and the pad oxide layer 302 are removed using a chemical etchant solution such as LAL ($NH_4F+HF$). The upper protruding portion of the trench nitride layer 212 may also be removed using conventional etching techniques. Accordingly, a trench isolation region is formed to provide excellent electrical isolation between adjacent active regions within a substrate, with reduced susceptibility to stress related degradation of the electrical properties of the substrate.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a trench isolation region, comprising the steps of:

forming a trench masking layer comprising a first material, on a semiconductor substrate;

etching a trench in the semiconductor substrate, using the trench masking layer as etching mask;

forming a trench oxide layer on a sidewall of the trench and on a sidewall of the trench masking layer; then forming a trench nitride layer comprising a second material different from the first material on the trench oxide layer so that the trench nitride layer extends opposite the sidewall of the trench and opposite the sidewall of the trench masking layer; then filling the trench with a trench insulating material;

removing the trench masking layer to expose an outer sidewall of the trench oxide layer, by selectively etching the trench masking layer with an etchant that selectively etches the first material at a higher rate than the second material; and etching back the trench insulating material, the trench oxide layer and the trench nitride layer, to define the trench isolation region.

2. The method of claim 1, wherein the trench masking layer comprises polysilicon.

3. The method of claim 2, wherein said step of etching back the trench insulating material comprises the steps of:

etching the trench insulating material and the outer sidewall of the trench oxide layer, to expose a protruding portion of the trench nitride layer extending between the trench oxide layer and the trench insulating material and above a surface of the semiconductor substrate; and then etching the protruding portion of the trench nitride layer.

4. The method of claim 3, wherein said step of forming a trench masking layer is preceded by the step of forming a pad oxide layer on a surface of the semiconductor substrate; and wherein said step of etching, the trench insulating material and the trench oxide layer comprises etching the trench insulating material, the trench oxide layer and the pad oxide layer.

5. The method of claim 2, wherein said step of removing the trench masking layer comprises etching the trench masking layer using an etching solution comprising $HNO_3$, $CH_3COOH$, HF and deionized water.

6. The method of claim 2, wherein said step of removing the trench masking layer comprises exposing the trench masking layer to a chlorine ambient.

7. The method of claim 1, wherein the trench nitride layer comprises a silicon-rich nitride layer as $Si_{3+\alpha}N_4$, where $\alpha>0$, and has a thickness in a range between about 70 Å and 300 Å.

8. The method of claim 4, wherein said step of etching the trench insulating material and the trench oxide layer comprises etching the trench insulating material, the trench oxide layer and the pad oxide layer in an etching solution comprising $NH_4F$ and HF.

9. The method of claim 1, wherein said step of filling the trench with a trench insulating material comprises the steps of:

depositing an undoped silicate glass layer in the trench; and depositing a PE-TEOS glass layer on the undoped silicate glass layer.

10. The method of claim 9, wherein said step of depositing a PE-TEOS layer is followed by the step of annealing the trench insulating material in a nitrogen ambient at a temperature in a range between about 1,000° C. and 1,200° C.

11. A method of forming a trench isolation region, comprising the steps of:

forming a first trench masking layer comprising a first material, on a semiconductor substrate;

forming a second trench masking layer comprising a second material that is different from the first material and is less susceptible to oxidation than the first material, on the first trench masking layer;

etching a trench in the semiconductor substrate, using the first trench masking layer as etching mask;

forming a trench oxide layer on a sidewall of the trench and on a sidewall of the first trench masking layer, by oxidizing the sidewall of the trench and the sidewall of the first trench masking layer; then forming a trench nitride layer comprising the second material on the trench oxide layer and on the second trench masking layer so that the trench nitride layer extends opposite a sidewall of the trench and opposite the sidewall of the first trench masking layer and a sidewall of the second trench masking layer; then filling the trench with a trench insulating material; then removing the second trench masking layer;

removing the first trench masking layer to expose an outer sidewall of the trench oxide layer, by selectively etching the first trench masking layer with an etchant that selectively etches the first material at a higher rate than the second material; and etching back the trench insulating material, the trench oxide layer and the trench nitride layer, to define the trench isolation region.

12. The method of claim 11, wherein the first trench masking layer comprises polysilicon.

13. The method of claim 12, wherein said step of etching back the trench insulating material comprises the steps of:

etching the trench insulating material and the outer sidewall of the trench oxide layer, to expose a protruding portion of the trench nitride layer extending between the trench oxide layer and the trench insulating material; and etching the protruding portion of the trench nitride layer.

14. The method of claim 13, wherein said step of forming a first trench masking layer is preceded by the step of forming a pad oxide layer on a surface of the semiconductor substrate; and wherein said step of etching the trench insulating material and the trench oxide layer comprises etching the trench insulating material, the trench oxide layer and the pad oxide layer simultaneously.

15. The method of claim 12, wherein said step of removing the first trench masking layer comprises etching the first trench masking layer using an etching solution comprising $HNO_3$, $CH_3COOH$, HF and deionized water.

16. The method of claim 12, wherein said step of removing the trench masking layer comprises exposing the first trench masking layer to a chlorine ambient.

17. The method of claim 11, wherein the trench nitride layer comprises a silicon-rich nitride layer as $Si_{3+\alpha}N_4$, where $\alpha>0$.

18. The method of claim 14, wherein said step of etching the trench insulating material and the trench oxide layer comprises simultaneously etching the trench insulating material, the trench oxide layer and the pad oxide layer in an etching solution comprising $NH_4F$ and HF.

19. The method of claim 11, wherein said step of filling the trench with a trench insulating material comprises the steps of:

depositing an undoped silicate glass layer in the trench; and depositing a PE-TEOS glass layer on the undoped silicate glass layer.

20. The method of claim 19, wherein said step of depositing a PE-TEOS layer is followed by the step of annealing the trench insulating material in a nitrogen ambient at a temperature in a range between about 1,000° C. and 1,200° C.

21. The method of claim 11, wherein the first trench masking layer comprises polysilicon; and wherein said step of forming a trench nitride layer is preceded by the step of selectively etching a sidewall of the first trench masking layer to define a recess underneath the second trench masking layer.

22. The method of claim 21, wherein said step of selectively etching a sidewall of the first trench masking layer uses a mixed gas comprising $SF_6$ and $Cl_2$.

23. The method of claim 21, wherein said step of selectively etching a sidewall of the first trench masking layer uses a mixed solution comprising $HNO_3$, $CH_3COOH$, HF and deionized water.

24. The method of claim 11, wherein said step of removing the second trench masking layer comprises the steps of:

exposing the second trench masking layer to a mixed gas consisting essentially of $CF_3$, Ar, $CHF_3$ and $O_2$; and then exposing the second trench masking layer to a mixed gas consisting essentially of Ar and $CHF_3$.

25. The method of claim 11, wherein said step of removing the second trench masking layer comprises exposing the second trench masking layer to a phosphoric acid solution.

26. The method of claim 13, wherein said step of etching the trench insulating material and the trench oxide layer comprises exposing the trench insulating material and the trench oxide layer to a solution comprising $NH_4F$ and HF.

* * * * *